United States Patent [19]
Nishihara et al.

[11] Patent Number: 5,181,317
[45] Date of Patent: Jan. 26, 1993

[54] METHOD OF MAKING AN ENGINEERING CHANGE TO A PRINTED WIRING BOARD

[75] Inventors: Mikio Nishihara, Tokyo, Japan; Teruo Murase, San Jose, Calif.; Kiyotaka Seyama, Kawasaki; Kiyoshi Kuwabara, Sagamihara; Osamu Ohshima, Yokohama, all of Japan

[73] Assignee: Fujitsu Limited, Kawasaki, Japan

[21] Appl. No.: 766,244

[22] Filed: Sep. 27, 1991

[30] Foreign Application Priority Data

Sep. 28, 1990 [JP] Japan ................................. 2-257524

[51] Int. Cl.[5] .............................................. H05K 3/34
[52] U.S. Cl. ..................................... 29/401.1; 29/423; 29/840
[58] Field of Search ................. 29/832, 834, 835, 836, 29/840, 842, 843, 402.09, 402.19, 423, 401.1; 361/400

[56] References Cited

U.S. PATENT DOCUMENTS

| | | | |
|---|---|---|---|
| 3,294,951 | 12/1966 | Olson | 29/832 X |
| 4,631,820 | 12/1986 | Harada et al. | 29/840 |
| 4,933,305 | 6/1990 | Kikhawa | 29/840 X |
| 5,001,829 | 3/1991 | Schelhorn | 29/840 |

*Primary Examiner*—Timothy V. Eley
*Attorney, Agent, or Firm*—Nikaido, Marmelstein, Murray & Oram

[57] ABSTRACT

A method of making an engineering change to a printed wiring board changes connection for a terminal of an electronic component which is mounted on the printed wiring board through a terminal pad. The terminal is electrically connected to a destination through the terminal pad and wiring within the printed wiring board. The present invention places an insulator, including an insulating material and a conductive layer formed thereon, between the terminal and the terminal pad. The electronic component is mounted on the printed wiring board and the terminal is electrically connected to the conductive layer. A discrete wire is placed between the conductive layer and the destination.

8 Claims, 6 Drawing Sheets

METHOD OF MAKING AN ENGINEERING CHANGE TO A PRINTED WIRING BOARD

BACKGROUND OF THE INVENTION

1. Field of the Invention

The present invention relates to making an engineering change to a printed wiring board which mounts electronic components for use in high-performance electronic equipment such as computers. With an ever-increasing integration density of electronic components as in large-scale integrated circuits (hereinafter called LSIs), the demand is also increasing for a printed wiring board which can mount LSIs and connections between LSIs at high density. A printed wiring board, used especially for large-scale computers and super computers, is becoming more and more complicated both in logical design and manufacturing process and eventually becomes subject to an engineering change.

Accordingly, an economic and effective method of making an engineering change to printed wiring boards can remedy poor manufacturing and can easily deal with a change in design.

2. Description of the Related Art

FIGS. 1(a)-1(b) show a method of making an engineering change to a printed wiring board, practicing the first related art of the present invention. FIG. 1(a) is a sectional view of a printed wiring board of the first related art. FIG. 1(b) is a top plan view of a printed wiring board of the first related art.

An etch-cut part 14 and a wire-bonding pad 15 are provided between a pin pad 4 and a through-hole land (or via pad) 13 on a printed wiring board 3. The pin pad 4 is for mounting an LSI pin. The through-hole land (or via pad) 13 leads to an inner layer 5 through a through-hole (or via) 12. To change wiring of the printed wiring board 3, the etch-cut part 14 is cut off to disconnect the wire-bonding pad 15 and pin pad 4 from the inner layer 5, and a discrete wire 8 (FIG. 1(b)) is connected to the wire-bonding pad 15.

FIGS. 2(a)-2(b) show a method of making an engineering change to a printed wiring board, practicing the second related art of the present invention. FIG. 2(a) is a sectional view of a printed wiring board of the second related art. FIG. 2(b) is a top plan view of a printed wiring board of the second related art.

A via pad 16 and a wire-bonding pad 15 are each connected to a pin pad 4 which mounts a pin 2 of an LSI 1. To change wiring of the printed wiring board 3, the etch-cut part 14, connecting the via pad 16 and pin pad 4, is cut by applying a laser beam, for example, to disconnect the pin pad 4 from the inner layer 5. A single wire 8 is placed between the wire-bonding pad 15 and a junction pad 17 and then, a wire 18 terminated in the characteristic impedance (e.g. twin lead is placed between the junction pad 17 and a destination junction pad (not shown).

However, a printed wiring board practicing the former method requires, as shown in FIGS. 1(a)-1(b), a large area for each LSI pin 2 for engineering change purpose. Therefore, the distance between adjacent LSI pins 2 eventually becomes large, which causes a delay in signal transmission and a decrease in processing speed of the electronic equipment.

A printed wiring board practicing the latter method requires only junction pads 17 near an LSI, which decreases the area required for an engineering change. However, since the etch-cut part 14, via pad 16 and wire-bonding pad 15 are provided between adjacent pin pads 4, there is naturally a limitation in decreasing a pin pitch. Moreover, cutting the etch-cut part 14 using a laser beam may a) fail to disconnect the pattern with a clear-cut section, b) carbonize the polyimide provided as an insulator layer between the signal and ground layers, or c) deteriorate the printed wiring board by damaging a pattern on a lower layer.

Therefore, a problem is that a printed wiring board 3 practicing the conventional methods of making an engineering change prevents high-speed signal transmission and, therefore, high-performance data processing because the pin pitch cannot be small enough as mentioned above. Another problem is that a printed wiring board practicing the conventional methods of making an engineering change is expensive because it requires the above-mentioned construction for each LSI pin 2. Still another problem is that the conventional methods of making an engineering change may deteriorate or damage a printed wiring board.

SUMMARY OF THE INVENTION

It is an object of the present invention to provide an economical and reliable method of making an engineering change to a printed wiring board.

It is another object of the present invention to provide a method of making an engineering change which can reduce the production cost of a printed wiring board.

It is still another object of the present invention to provide a method of making an engineering change which can be applied to a printed wiring board of high wiring density.

To achieve the above and other objects, the present invention places an insulator between the terminal concerned with the engineering change and its terminal pad, and mounts the electronic component on the printed wiring board so that the terminal is electrically disconnected from the wiring within the printed wiring board.

BRIEF DESCRIPTION OF THE DRAWINGS

Throughout the above-mentioned drawings, identical reference numerals are used to designate the same or similar component parts.

DESCRIPTION OF THE PREFERRED EMBODIMENTS

Figure 3A:
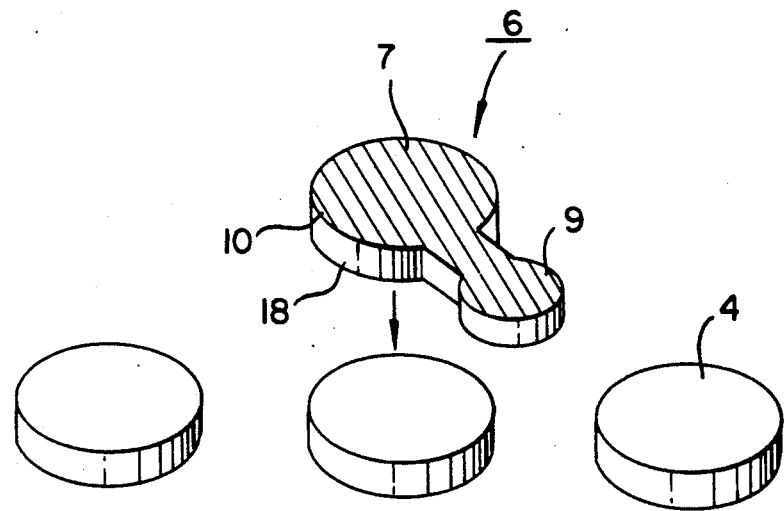
FIGS. 3(a)-3(b) show a method of making an engineering change to a printed wiring board, practicing the first embodiment of the present invention.
Figure 3B:
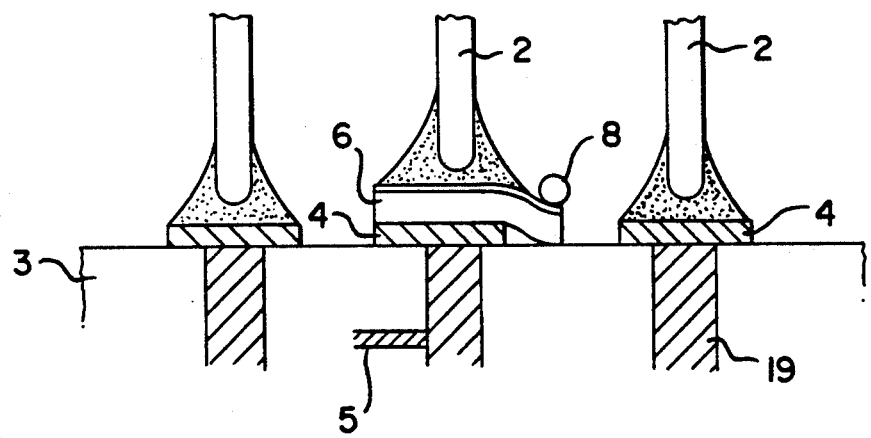

FIGS. 3(a)-3(b) show a method of making an engineering change to a printed wiring board, practicing the first embodiment of the present invention. FIG. 3(a) is a sectional view of a printed wiring board of the first embodiment. FIG. 3(b) is a perspective view of a pin pad of the first embodiment.

As shown in FIG. 3(b), a pin pad 4 is provided on a printed wiring board 3 to mount pins 2 of a pin grid array (PGA)-type LSI 1 (not shown). The printed wiring board 3 practicing the present invention requires only pin pads 4 to mount pins 2 of PGA-type LSIs 1 and does not require the etch-cut parts 14 required in the conventional method. An engineering change of the thus-constructed printed wiring board 3 is conducted by attaching a repair pad 6 on a pin pad 4.

As shown in FIG. 3(a), the repair pad 6 is made of an insulator 18 and a conductive layer 7 formed thereon. For example, the repair pad 6 is produced by punching out in a shape as shown in FIG. 3(a), from a sheet of approximately 10 micron-thick polyimide thin-film with a conductive layer 7 formed thereon. The repair pad 6 includes a wire-bonding part 9 and a pin-mounting part 10 of about the same diameter as the pin pad 4. It is desirable that the repair pad 6 is of good solder wetting and is provided with a solder dam between the pin-mounting part 10 and wire-bonding part 9.

Figure 1A:
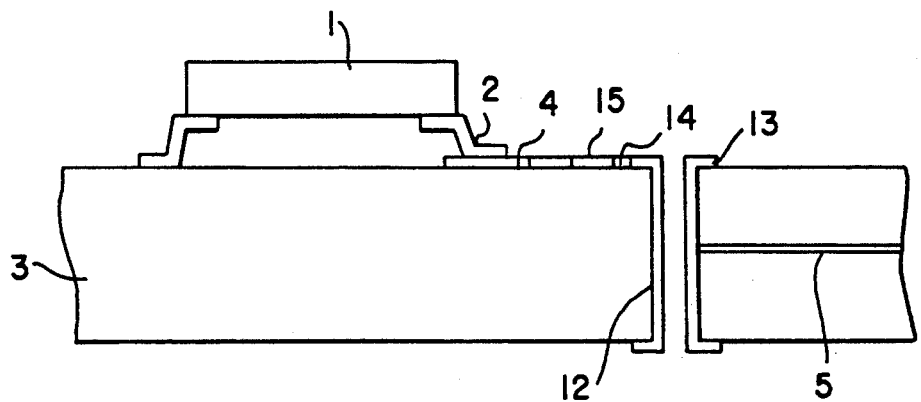
FIGS. 1(a)-1(b) show a method of making an enginerring change to a printed wiring board, practicing the first related art of the present invention.
Figure 1B:
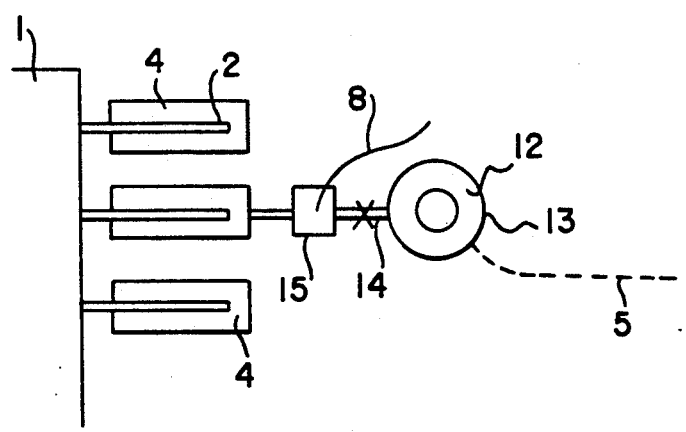
Figure 2A:
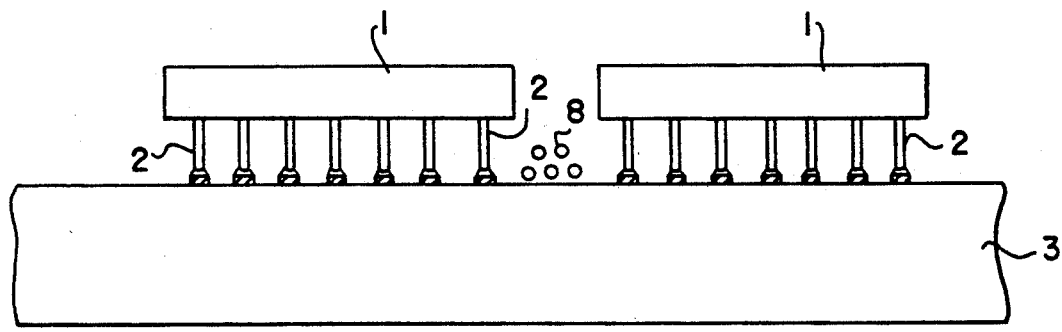
FIGS. 2(a)-2(b) show a method of making an engineering change to a printed wiring board, practicing the second related art of the present invention.
Figure 2B:
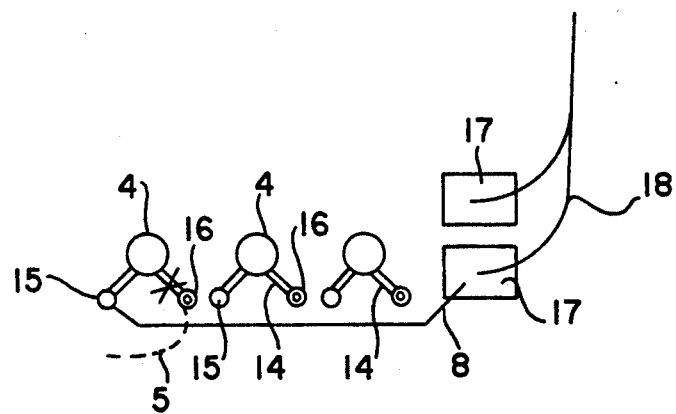

To actually make an engineering change on an LSI pin 2 of the so-constructed printed wiring board 3, a repair pad 6 is attached onto the pin pad 4 concerned. Then, the LSI pin 2 is connected to the pin-mounting part 10 of the repair pad 6 and, thus, the pin 2 is disconnected from the inner layer 5 which was connected to the pin 2 through a via 19. Finally, the wire-bonding part 9 of the repair pad 6 is connected to a joint pad 17 (see FIG. 2) by a single wire 8 to complete the engineering change.

Figure 4:
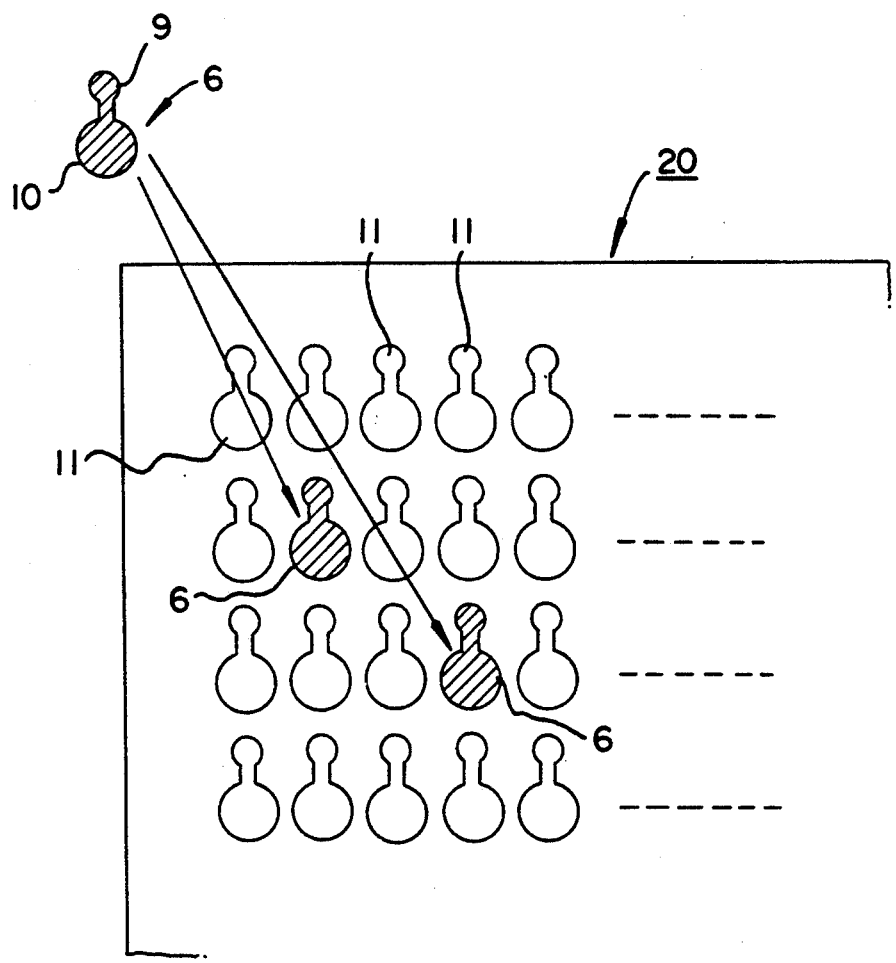
FIG. 4 shows a jig for positioning a repair pad on a pin pad.

To position a minute repair pad 6 on the pin pad 4 in place, a jig 20 as shown in FIG. 4 is preferably used. The jig 20 has holes 11 punched out in the same arrangement as the pin pads 4 and in the same shape as the repair pads 6. When used, a repair pad 6 is filled and half fixed only in the jig hole 11 which corresponds to the pin 2 concerned with engineering change. An adhesion layer is formed beforehand on the back of the repair pad 6 and on top of the concerned pin pad 4. When the jig 20 is placed on the printed wiring board 3, the repair pad 6 is attached onto the pin pad 4 and keeps attached even after the jig 20 is taken off.

Figure 5A:
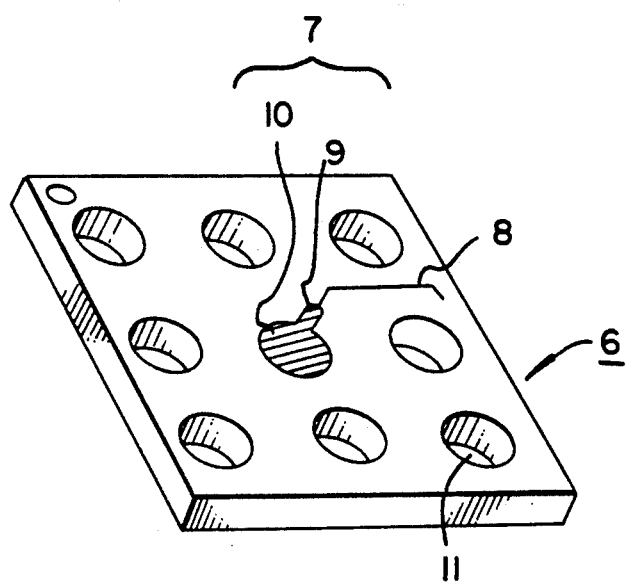
FIGS. 5(a)-5(b) show a method of making an engineering change to a printed wiring board, practicing the second embodiment of the present invention.
Figure 5B:
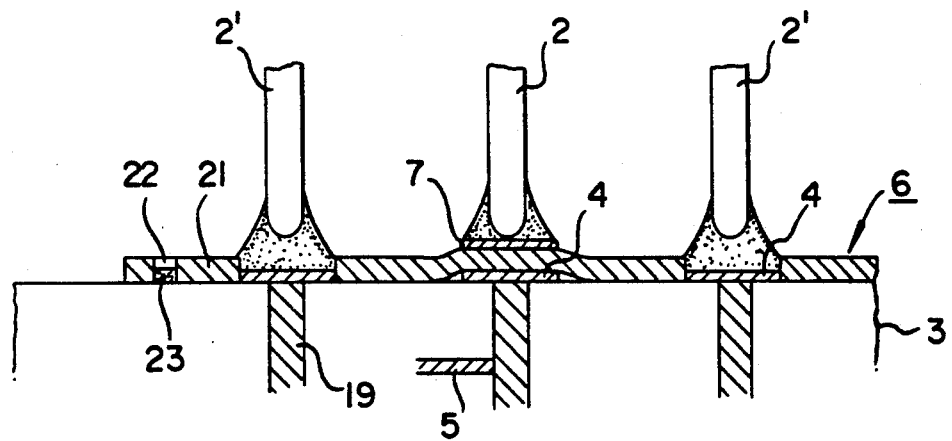

FIGS. 5(a)-5(b) show a method of making an engineering change to a printed wiring board, practicing the second embodiment of the present invention. FIG. 5(a) is a sectional view of a printed wiring board of the second embodiment. FIG. 5(b) is a perspective view of a pin pad of the second embodiment.

In FIG. 5(b), a pin pad 4 is connected to an inner layer 5 through a via 19. When an engineering change is made, a repair sheet 6 as shown in FIG. 5(a) is placed on the printed wiring board and under an LSI 1 (not shown).

In FIG. 5(a), the repair sheet 6 is a thin-film insulator sheet having about the same area as the LSIs 1 and having holes punched at the positions corresponding to the pins 2 not concerned with the engineering change.

Figure 6:
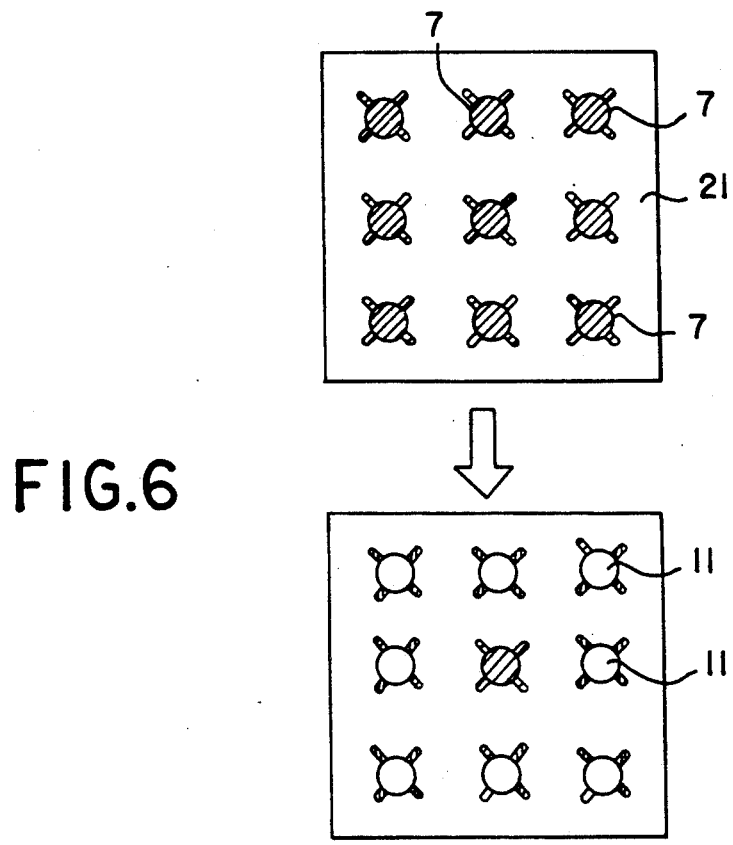
FIG. 6 shows the first method of producing a repair sheet practicing the second embodiment of the present invention.

FIG. 6 shows the second method of producing a repair sheet practicing the second embodiment of the present invention.

As shown in FIG. 6, the repair sheet 6 is produced through a thin-film process on a polyimide thin-film 21, by forming conductive layers 7 at the same positions as the pin pads 4 arranged on the printed wiring board 3. When used for an engineering change, all the conductive layers 7 are punched off except the one which corresponds to the pin pad 4 concerned with the engineering change. The thus-prepared repair sheet 6 is placed on the printed wiring board 3 and then LSIs 1 are mounted on the repair sheet 6. The LSI 1 is mounted such that the pins 2' (FIG. 5(b)) not concerned with the engineering change are positioned to face the pin pad 4 through the hole 11 of the repair sheet 6, while the pin 2 concerned with the engineering change is positioned on the pin-mounting part 10 of the conductive layer 7 left on the repair sheet 6. Then, the pins 2' not concerned with the engineering change are soldered to the pin pads 4 on the printed wiring board 3, and the pins 2 concerned with the engineering change are soldered to the conductive layer 7 of the repair sheet 6.

To precisely position the repair sheet 6 on the printed wiring board 3, it is effective to provide solder bumps 23 (FIG. 5(b)) on the printed wiring board 3 and positioning holes 22 in the repair sheet 6, so that the solder bumps 23 are engaged in the positioning holes 22.

Figure 7:
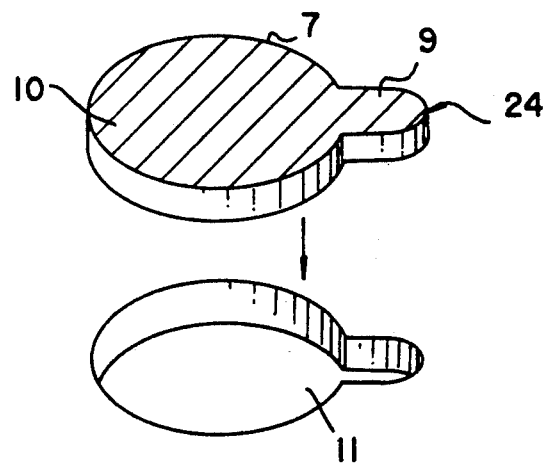
FIG. 7 shows the second method of producing a repair sheet practicing the second embodiment of the present invention.

In the above-mentioned example, the repair sheet 6 is punched at the positions where the pins 2' exist which are not concerned with the engineering change. Instead, the repair sheet 6 can be constructed such that holes 11 are punched at all the positions corresponding to the pins 2, and an insulator piece 24 with a conductive layer 7 formed on the surface is stuffed into the hole 11 which corresponds to the pin 2 concerned with the engineering change (see FIG. 7).

According to the present invention as described above, an engineering change is performed by mounting an LSI on the printed wiring board 3 with some pins soldered onto the repair sheet 6 and others soldered onto the pin pads 4. The wire-bonding part 9 of the conductive layer 7 is then connected to the joint pad 17 using a discrete wire 8. The repair sheet 6 may be printed with a lead connecting the wire-bonding part 9 to a terminal provided at an end of the repair sheet 6.

The present invention can apply not only to PGA-type LSIs but to those of various types such as a flat package-type.

As is apparent by the above description, disconnecting a pin pad 4 from an inner layer, which is indispensable in an engineering change, is done by placing a thin-film insulator 6 between the pin pad 4 and the LSI pin 2 concerned with the engineering change, without a need to cut a pattern connecting the pin pad 4 to an inner layer 5 using a laser beam, for example. Therefore, the printed wiring board 3 is free from damage and deterioration.

Moreover, there is no need to provide a wire-bonding pad 15, etc., on a printed wiring board for engineering change purpose, making an engineering change to a printed wiring board of high wiring density reliable and at a low cost.

From the foregoing description of the preferred embodiment of the invention, it will be apparent that many modifications may be made therein. It should be understood that these embodiments are intended as one example of the invention only, and that the invention is not limited thereto. Therefore, it should be understood that the appended claims are intended to cover all modifications that fall within the true spirit and scope of the invention.

What is claimed is:

1. A method of making an engineering change to a printed wiring board to change a connection for a terminal of an electronic component, which is mounted on the printed wiring board, through a terminal pad, the terminal being electrically connected to a destination through the terminal pad and wiring within the printed wiring board, said method of making the engineering change comprising the steps of:

placing an insulator between the terminal and the terminal pad; and mounting the electronic component on the printed wiring board, wherein the terminal is electrically disconnected from the wiring within the printed wiring board through the insulator.

2. A method of making an engineering change to a printed wiring board according to claim 1, further comprising the steps of forming said insulator from a piece of an insulating material and forming a conductive layer on said insulating material.

3. A method of making an engineering change to a printed wiring board according to claim 2 further comprising the steps of:

manufacturing a jig by punching holes at positions corresponding to the terminal pads arranged on the printed wiring board;

filling said insulator in a jig hole corresponding to the terminal pad for the terminal concerned with the engineering change;

placing said jig with said insulator filled in the hole on the printed wiring board in position; and attaching said insulator onto the terminal pad and taking off said jig.

4. A method of making an engineering change to a printed wiring board according to claim 1, further comprising the steps of forming said insulator from a sheet of an insulating material, forming a conductive layer on said insulating material for the terminal and punching a hole therein for respective remaining terminals.

5. A method of making an engineering change to a printed wiring board according to claim 2 or 4, further comprising the steps of:

electrically connecting the terminal to said conductive layer; and placing a discrete wire between said conductive layer and the destination.

6. A method of making an engineering change to a printed wiring board according to claim 4, wherein said step of forming said insulator further comprises the steps of:

forming conductive layers on said insulating material at positions corresponding to the terminal pads arranged on the printed wiring board; and punching out the conductive layers except at one conductive layer which corresponds to a terminal pad for the terminal concerned with the engineering change.

7. A method of making an engineering change to a printed wiring board according to claim 4, wherein said step of forming said insulator further comprises the steps of:

punching holes in said insulating material at positions corresponding, to the terminal pads arranged on the printed wiring board; and stuffing a piece of an insulating material with a conductive layer formed on a surface into one hole which corresponds to the terminal pad for the terminal concerned with the engineering change.

8. A method of making an engineering change to a printed wiring board according to claim 4 further comprising the steps of:

providing a bump on the printed wiring board;

providing a holes in said insulator; and engaging said bump in said hole.

* * * * *